(12) United States Patent
Beck et al.

(10) Patent No.: US 9,727,228 B2
(45) Date of Patent: Aug. 8, 2017

(54) METHOD FOR SELECTING WAVEFORMS ON ELECTRONIC TEST EQUIPMENT

(71) Applicant: Keysight Technologies, Inc., Minneapolis, MN (US)

(72) Inventors: Douglas James Beck, Loveland, CO (US); Daniel P. Timm, Loveland, CO (US); Kristopher A. Larsen, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 634 days.

(21) Appl. No.: 13/775,037

(22) Filed: Feb. 22, 2013

(65) Prior Publication Data

US 2014/0240240 A1    Aug. 28, 2014

(51) Int. Cl.
  *G06F 3/041*    (2006.01)
  *G06F 3/0488*   (2013.01)
  *G06F 3/0484*   (2013.01)
  *G01R 13/02*    (2006.01)

(52) U.S. Cl.
  CPC ........ *G06F 3/0488* (2013.01); *G06F 3/04842* (2013.01); *G06F 3/04845* (2013.01); *G01R 13/029* (2013.01); *G01R 13/0245* (2013.01); *G06F 2203/04806* (2013.01)

(58) Field of Classification Search
  CPC .... G06F 3/0481; G06F 3/0482; G06F 3/0484; G06F 3/04842; G06F 3/041; G06F 3/0418; G01R 13/28
  USPC ............................ 345/173–183; 715/700–866
  See application file for complete search history.

(56) References Cited

U.S. PATENT DOCUMENTS

| | | | |
|---|---|---|---|
| 4,766,425 A | 8/1988 | Tallman et al. | |
| 4,821,030 A * | 4/1989 | Batson et al. | 345/173 |
| 6,774,890 B2 * | 8/2004 | Engholm | 345/173 |
| 2005/0035954 A1 * | 2/2005 | Allen | 345/173 |
| 2009/0265126 A1 * | 10/2009 | Freidhof | 702/68 |
| 2010/0026713 A1 | 2/2010 | Goto et al. | |
| 2010/0056128 A1 * | 3/2010 | Hwang et al. | 455/418 |
| 2011/0074698 A1 * | 3/2011 | Rapp et al. | 345/173 |
| 2011/0078597 A1 * | 3/2011 | Rapp et al. | 715/765 |
| 2011/0201911 A1 * | 8/2011 | Johnson et al. | 600/365 |

(Continued)

OTHER PUBLICATIONS

Le Croy Corporation, WavePro 7000A Series Oscilloscopes, Oct. 2006.

(Continued)

*Primary Examiner* — Roberto Flores (57) ABSTRACT

A method for operating a data processing system having a touch enabled display screen that displays a plurality of waveforms to alter the display of one of the waveforms without altering the display of the remaining waveforms is disclosed. The method includes determining a selected waveform in response to a user touching the display screen in a first location thereby defining a touch area that determines the selected waveform. An operation that is to be performed on the selected waveform is then defined by a gesture on the screen. The selected waveform is determined by a touch area that is defined by the user touching the screen. If more than one waveform is defined by the touch area, the possible waveforms are sequentially selected until the correct one is presented to the user in response to the user repeating the touching that defines the touch area.

18 Claims, 6 Drawing Sheets

(56) References Cited

U.S. PATENT DOCUMENTS

2013/0038540 A1\* 2/2013 Anderson et al. ............ 345/173
2013/0346924 A1\* 12/2013 Morrill et al. ................ 715/863
2014/0015809 A1\* 1/2014 Zay et al. ..................... 345/178

OTHER PUBLICATIONS

John Rizzo, The Labtop Mac, MacUser vol. 5, No. 7, Jul. 1, 1989, Ziff-Davis Publishing Company.
Concilium Technologies, Oscilloscopes Boast Touch Triggering, Jan. 23, 2013, Dataweek.

\* cited by examiner

METHOD FOR SELECTING WAVEFORMS ON ELECTRONIC TEST EQUIPMENT

BACKGROUND

Computer applications that utilize touch screens for communication between the program running on the computer and the user are increasingly commonplace. As a result, electronic instruments are migrating toward the use of touch screens for mediating the interaction between the user and the control of the instrument. In particular, touch screens are being used in oscilloscopes. Oscilloscopes, however, present unique problems when gestures are used to select and manipulate waveforms on the screen.

On prior art oscilloscopes, a user selects a waveform on the screen by touching the waveform. The oscilloscope display, however, differs from a tablet or similar touch screen enabled device in that the oscilloscope display can have a number of overlapping waveforms that are displayed simultaneously. Typically, the oscilloscope displays waveforms from a plurality of channels simultaneously. These waveforms often overlap. Hence, to select a particular waveform by touching the screen, the user must find a place on the screen in which that waveform is isolated from the other waveforms by an amount that allows the user to touch that trace without the user's finger touching another trace on the screen. Finding an appropriately isolated area presents challenges in many cases. Hence, the computer program often selects the wrong trace. In this regard, it should be noted that the touch area on the screen is an area the size of the user's fingertip. Hence, even though two waveforms appear to be separated on the screen, the user actually touches both waveforms. The computer program typically selects one of the waveforms, which in many cases is the wrong waveform.

In addition, users often regard the area around a waveform as being part of that waveform. For example, users often regard the area under a pulse as being part of the waveform. Hence, the user tries to select the pulse waveform by touching the screen in the area under the peak of the pulse. However, the computer program does not recognize this area as part of the waveform, and hence, no waveform is selected.

Oscilloscope displays also differ from conventional tablets and similar devices in that the gestures being performed on the screen are directed to a single waveform, rather than the displayed image as a whole. For example, a "pinch" gesture on a tablet is normally used to zoom in or zoom out on the scene being displayed. That is, the gesture is used to change the magnification of the scene. On an oscilloscope, the user usually wishes to change the gain or time scale of a single trace, while leaving the gain or time scale of the other traces unchanged.

SUMMARY

The present invention includes a method for operating a data processing system having a touch enabled display screen that displays a plurality of waveforms to alter the display of one of the waveforms without altering the display of the remaining waveforms. The method includes determining a selected waveform in response to a user touching the display screen in a first location thereby defining a touch area that determines the selected waveform. An operation that is to be performed on the selected waveform is then defined by a gesture on the screen.

In one aspect of the invention, determining the selected waveform includes determining if the user touching the screen is a repeat touching in the touch area. If the touching is a repeat touching, determining which of a plurality of waveforms passing through the touch area has not been previously selected and selecting one of the waveforms that has not been previously selected as the selected waveform.

In another aspect of the invention, determining the selected waveform includes determining if the gesture defining the operation unambiguously defines one of the plurality of waveforms and selecting that one of the plurality of waveforms.

In a still further aspect of the invention, an icon that corresponds to one of the plurality of waveforms is present in the touch area and that one of the plurality of waveforms is selected.

In another aspect of the invention, determining the selected waveform includes determining that no waveform passes through the touch area. In this case, the display is searched on each side of the touch area to determine waveforms that are encountered on each side of the touch area and one of the encountered waveforms is selected as the selected waveform. In another aspect, the selected waveform is defined to be the encountered waveform only if the same waveform is encountered on both sides of the touch area.

In a still further aspect of the invention, if the touch area defines more than one of the plurality of waveforms as a possible selected waveform one of those waveforms is selected as the selected waveform. In this case, a message to the user that more than one waveform corresponds to the touch area may be displayed.

DETAILED DESCRIPTION

Figure 1:
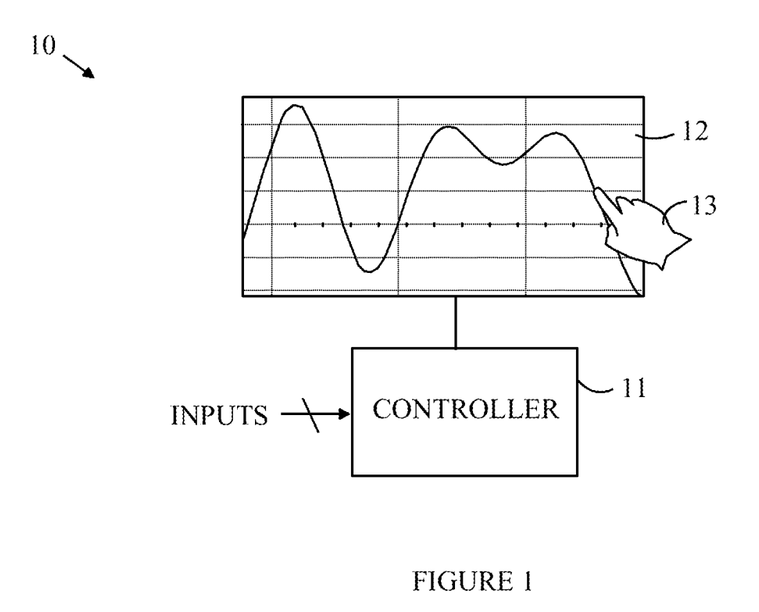
FIG. 1 illustrates an oscilloscope that utilized a touch enabled screen for communicating with a user.

The manner in which the present invention provides its advantages can be more easily understood with reference to FIG. 1, which illustrates an oscilloscope that utilized a touch enabled screen for communicating with a user. Oscilloscope 10 includes a controller 11 that receives one or more signal inputs whose amplitudes are measured as a function of time. The measured amplitudes are displayed on a touch-enabled screen 12. A user 13 selects specific waveforms that are displayed on screen 12 and manipulates those waveforms by gestures performed on screen 12. Controller 11 can be implemented in any suitable data processing system such as a general purpose computer or specialized hardware.

For the purposes of this discussion, a gesture is defined to be an interaction in which the user places one or more fingers on the screen and optionally moves the finger(s). In a tap gesture, the user touches the screen with one finger and then lifts the finger without moving the finger on the screen while the finger is in contact with screen. In a drag gesture, the user places one finger on the screen and then moves that finger in a predetermined manner while the finger remains in contact with screen. In a pinch gesture, the user places two fingers on the screen and moves the fingers relative to one another while both fingers remain in contact with the screen.

The present invention provides a method for selecting a trace on an oscilloscope when the trace is not necessarily isolated from other traces. In one aspect of the invention, the user selects a trace by touching an area on the screen through which the trace passes. If the region encompassed by the touch only has a single trace passing there through, that trace is selected. If multiple traces pass through the region, one of the traces is selected and illuminated. If the selected trace is the wrong trace, the user again touches the same area. The program responds to the repeated touch by selecting another one of the possible traces.

Figure 2:
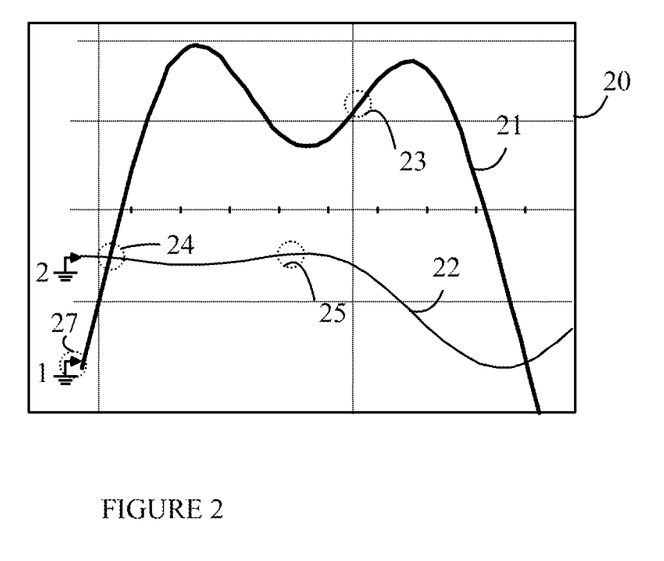
FIG. 2 illustrates a portion of an oscilloscope display screen through which two traces pass.

Refer now to FIG. 2, which illustrates a portion of an oscilloscope display screen through which two traces shown at 21 and 22 pass. The present invention defines a touch area around any point at which the user touches screen 20. In one aspect of the invention, this area is approximately the size of the spot on the screen created by the user touching the screen with his or her finger. The size of the spot in question is shown by the areas labeled 23-25. If the user touches the screen at 23, there is only one possible trace passing through that area, and that is the trace corresponding to channel 1 of the oscilloscope, as indicated by the ground icon marked 1. Similarly, if the user touches the screen in area 25, the only waveform is that corresponding to channel 2. In these cases, the controller assumes that the user wishes to select the corresponding channel and highlights the trace from that channel accordingly. In the example shown in FIG. 1, channel 1 was selected.

If, in contrast, the user touches the screen at area 24, there are two possible traces in that area, and hence, the choice of channel is ambiguous. The controller notes the two possible choices and picks one. The selected channel is highlighted. If the highlighted channel is not what the user wanted, the user again touches the screen in area 24, and the controller selects the next possible trace. This process is repeated until the user decides that the currently highlighted channel is the desired channel.

Figure 3:
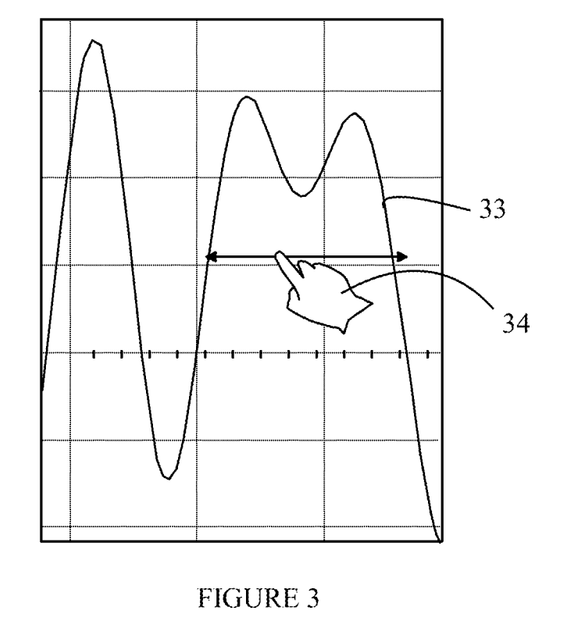
FIG. 3 illustrates the selection of a waveform that has a peak.

The above-described method assumes that at least one waveform passes through the touch area. However, as noted above, users often consider the area under a peak as belonging to the waveform in which the peak is located. In this case, there is no waveform passing through the touch area. Refer now to FIG. 3, which illustrates the selection of a waveform that has a peak. Waveform 33 includes a peak that is selected by user 34 tapping the screen at a location under the peak. The present invention accommodates this case by examining the pixels to the left and right of the touch area. The controller moves laterally through the pixels to the left of the touch area until a waveform is encountered. Denote this waveform by the "left" waveform. Similarly, the controller examines the pixels to the right of the touch area until a waveform is found. Denote this waveform by the "right" waveform. If the left and right waveforms are the same, the controller assumes that the user wished to select that waveform. In one embodiment, if either the left or right waveform is missing, i.e., the edge of the display screen is encountered before a waveform is found, then no waveform is selected. Alternatively, if only one of the left and right waveforms is found, that waveform is selected.

In one embodiment, if the left waveform is different from the right waveform, no selection is made. In another embodiment, the selection is treated as being ambiguous, and one of the two waveforms is selected. If the user taps the screen a second time in the same area, the other waveform is selected in a manner analogous to that discussed above.

In some cases, the waveforms being displayed may be too overlapping or complex to allow a touch area that selects only one waveform to be defined. If the display has an icon corresponding to each of the displayed waveforms, the user can touch that icon. In this case, the controller selects the trace corresponding to that icon. Referring again to FIG. 2, oscilloscope displays often include a ground icon corresponding to each trace. The user can touch the ground icon as indicated at 27 to select the corresponding trace. If only one icon is present in the touch area, the controller selects the trace corresponding to the icon within the touch area. In one embodiment, if there are multiple icons within the touch area, the selection is treated as being ambiguous, and the controller selects one of the traces. If the trace is not the trace desired by the user, the user again touches the same touch area, and the controller selects the other trace. If more than two icons are present, the controller cycles through the possible traces in a manner analogous to that described above until the correct trace is selected.

Figure 4:
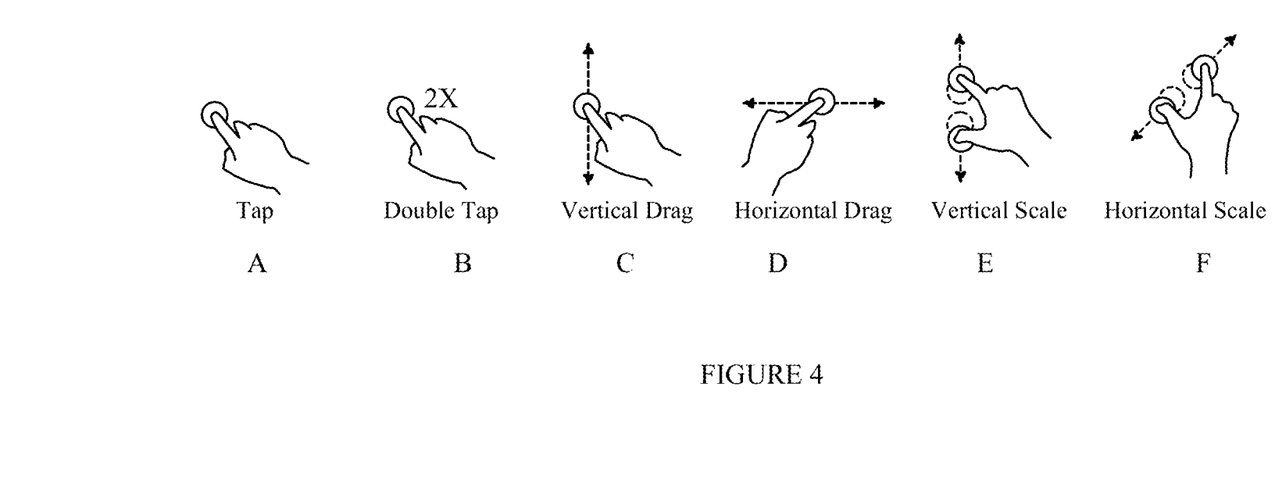
FIGS. 4A-4F illustrate the gestures implemented in one embodiment of the present invention.

Once a waveform is selected, the user can manipulate that waveform using one or more gestures. Refer now to FIGS. 4A-4F, which illustrate the gestures implemented in one embodiment of the present invention. The first gesture is a single tap gesture as shown at FIG. 4A. This is the gesture used to select a waveform as discussed above.

The second gesture is a double tap gesture as shown at FIG. 4B. This gesture zooms in on the selected waveform by a factor of two. That is, the vertical and horizontal gains associated with the selected waveform are increased by a factor of two and the center of the display for that waveform is moved to the location of the double tap. The double tap is used to round the last action, either scale or offset. For example, if an offset is 101 ns, a double tap would round it to exactly 100 ns.

The third and fourth gestures indicate a vertical and horizontal drag operation, respectively. These are shown at FIGS. 4C and 4D, respectively. In these gestures, the user moves his or her finger in the desired direction while maintaining contact with the touch screen. The selected trace is moved in the direction of motion of the finger. In the more general case, the drag operation can be performed in an arbitrary direction. The drag operation allows the user to move the selected waveform relative to the other waveforms so that the selected waveform can be isolated or compared to one or more of the other waveforms.

The fifth and sixth gestures indicate a vertical and horizontal pinch operation, respectively. These are shown at FIGS. 4E and 4F, respectively. In these gestures, the user touches the screen at two locations simultaneously and moves his or her finger together or apart in the desired direction while maintaining contact with the touch screen. The vertical or horizontal scale of the selected trace is increased or decreased depending on the direction of motion of the fingers.

Figure 5:
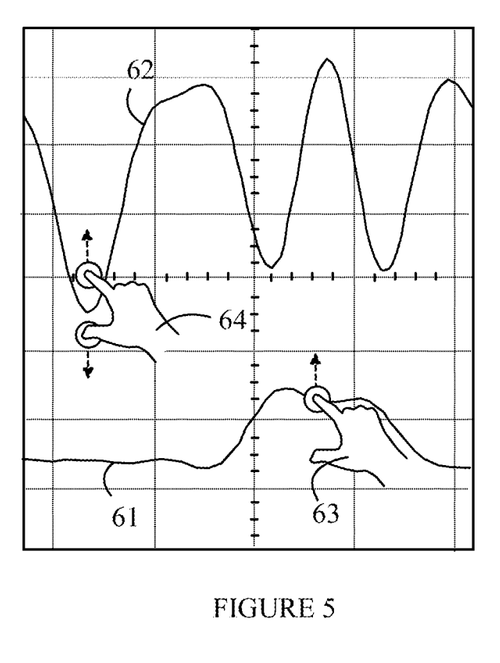
FIG. 5 illustrates the automatic selection of a waveform.

In the above-described gestures, it is assumed that a unique waveform has been selected to which the gesture is applied. The waveform could be selected using the tap gestures described above. However, in cases in which there is only one possible waveform to which the gesture applies, the controller automatically selects that waveform as the waveform in question without requiring the user to perform a separate selection gesture. Refer now to FIG. 5, which illustrates the automatic selection of a waveform. Consider a drag gesture 63 that is to be performed on a waveform 61. The user starts the gesture by touching the screen at a location through which waveform 61 passes. If there is only one waveform in the touch area, the controller assumes that the user has selected that waveform and that waveform is moved in response to the drag gesture.

Similarly, when the user starts a pinch gesture on waveform 62 as shown at 64, the user touches the screen at two locations simultaneously. If there is only one waveform that crosses a line connecting the two fingers, the controller selects that waveform as the waveform to which the pinch gesture is applied. Hence, the user is relieved of the task of specifying the waveform before performing the gesture.

Figure 6:
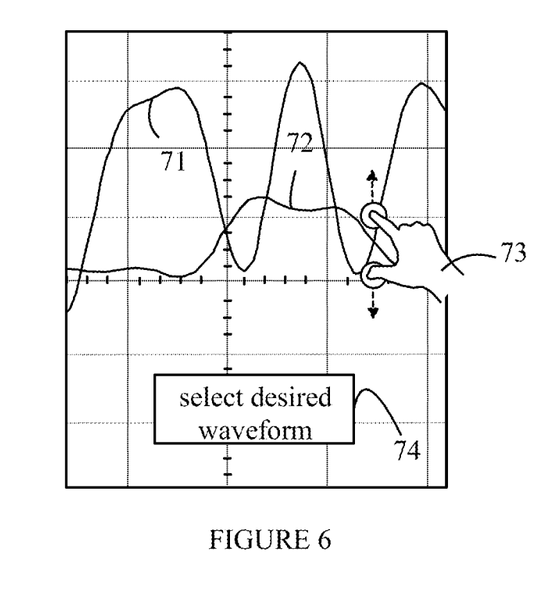
FIG. 6 illustrates a case in which the choice of waveform is ambiguous.

The above examples assume that there is a unique waveform that is defined by the gesture. Refer now to FIG. 6, which illustrates a case in which the choice of waveform is ambiguous. In this example, user 73 attempts to perform a pinch gesture in a region in which both waveforms 71 and 72 are between the user's fingers. In one aspect of the invention, if there is not such a unique waveform, the controller does not execute the method associated with the gesture. In this case, the controller can display a message 74 indicating that there are multiple waveforms to which the gesture could apply and request that the user select the desired one.

A similar message can be provided in the case of selecting a waveform using the single tap discussed above. That is, if there are multiple waveforms in the touch area, the controller selects one as discussed above and also displays a pop-up message indicating that the choice is ambiguous. The message could instruct the user to tap again if the selected trace was not the desired trace.

The user interface can define a method to undo an action in a well defined way. For example, in Windows 7, the most common method to undo an action is to choose the "Edit" menu and select "Undo". Naturally, the method for performing an undo varies from system to system. A unique gesture could be defined for an undo as well.

The present invention also includes a computer readable medium that stores instructions that cause a data processing system to execute the method of the present invention. A computer readable medium is defined to be any medium that constitutes patentable subject matter under 35 U.S.C. 101. Examples of such media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for operating a data processing system having a touch enabled display screen that displays a plurality of waveforms, said method comprising:
   determining a selected waveform in response to a user touching said display screen in a first location thereby defining a touch area that determines said selected waveform; and
   determining an operation to be performed on said selected waveform that is defined by a gesture on said screen, said operation leaving any remaining waveforms unaltered, said gesture being separate from said user touching said display screen at said first location.

2. The method of claim 1 wherein determining said selected waveform comprises:
   determining if said user touching is a repeat touching in said touch area;
   if said touching is a repeat touching determining which of a plurality of waveforms passing through said touch area has not been previously selected; and
   selecting one of said waveforms that has not been previously selected as said selected waveform.

3. The method of claim 1 wherein determining said selected waveform comprises determining if said user touching said display screen unambiguously defines one of said plurality of waveforms and selecting that one of said plurality of waveforms.

4. The method of claim 1 wherein an icon that corresponds to one of said plurality of waveforms is present in said touch area and that one of said plurality of waveforms is selected.

5. The method of claim 1 further comprising determining if said touch area defines more than one of said plurality of waveforms as a possible selected waveform; and
   selecting one of said possible selected waveforms as said selected waveform.

6. The method of claim 5 further comprising displaying a message to said user that more than one waveform corresponds to said touch area.

7. The method of claim 1 wherein a waveform that passes through said touch area is selected as said selected waveform.

8. A method for operating a data processing system having a touch enabled display screen that displays a plurality of waveforms, said method comprising:
   determining a selected waveform in response to a user touching said display screen in a first location thereby defining a touch area that determines said selected waveform; and
   determining an operation to be performed on said selected waveform that is defined by a gesture on said screen, said operation leaving any remaining waveforms unaltered,
   wherein determining said selected waveform comprises determining that no waveform passes through said touch area;
   searching said display screen on each side of said touch area to determine waveforms that are encountered on each side of said touch area; and
   selecting one of said encountered waveforms as the selected waveform.

9. The method of claim 8 wherein said selected waveform is defined to be said one of said encountered waveforms only if the same waveform is encountered on both sides of said touch area.

10. A non-transitory computer readable medium comprising instructions that cause a data processing system to execute a method for operating a display screen that is part of said data processing system, said method comprising:
   determining a selected waveform in response to a user touching said display screen in a first location thereby defining a touch area that determines said selected waveform; and
   determining an operation to be performed on said selected waveform that is defined by a gesture on said display screen, said operation leaving any remaining waveforms unaltered, said gesture being separate from said user touching said display screen at said first location.

11. The non-transitory computer readable medium of claim 10 wherein determining said selected waveform comprises:
- determining if said user touching is a repeat touching in said touch area;
- if said touching is a repeat touching determining which of a plurality of waveforms passing through said touch area has not been previously selected; and
- selecting one of said waveforms that has not been previously selected as said selected waveform.

12. The non-transitory computer readable medium of claim 10 wherein determining said selected waveform comprises determining if said user touching said display screen unambiguously defines one of said plurality of waveforms and selecting that one of said plurality of waveforms.

13. The non-transitory computer readable medium of claim 10 wherein an icon that corresponds to one of said plurality of waveforms is present in said touch area and that one of said plurality of waveforms is selected.

14. The non-transitory computer readable medium of claim 10 wherein determining said selected waveform comprises determining that no waveform passes through said touch area;
- searching said display screen on each side of said touch area to determine waveforms that are encountered on each side of said touch area; and
- selecting one of said encountered waveforms as the selected waveform.

15. The non-transitory computer readable medium of claim 14 wherein said selected waveform is defined to be said encountered waveform only if the same waveform is encountered on both sides of said touch area.

16. The non-transitory computer readable medium of claim 10 further comprising determining if said touch area defines more than one of said plurality of waveforms as a possible selected waveform; and
- selecting one of said possible selected waveforms as said selected waveform.

17. The non-transitory computer readable medium of claim 16 further comprising displaying a message to said user that more than one waveform corresponds to said touch area.

18. The non-transitory computer readable medium of claim 10 wherein a waveform that passes through said touch area is selected as said selected waveform.

* * * * *